United States Patent
Chang

(10) Patent No.: US 10,124,720 B2
(45) Date of Patent: Nov. 13, 2018

(54) APPARATUS FOR CONTROLLING FORCED LIGHT UP OF BRAKE LIGHTS

(71) Applicant: SAM WON TECH CO., LTD., Busan (KR)

(72) Inventor: Kyunghie Chang, Busan (KR)

(73) Assignee: SAM WON TECH CO., LTD., Busan (KR)

( * ) Notice: Subject to any disclaimer, the term of this patent is extended or adjusted under 35 U.S.C. 154(b) by 0 days.

(21) Appl. No.: 15/540,564

(22) PCT Filed: Dec. 2, 2015

(86) PCT No.: PCT/KR2015/013066
§ 371 (c)(1),
(2) Date: Jun. 28, 2017

(87) PCT Pub. No.: WO2016/108441
PCT Pub. Date: Jul. 7, 2016

(65) Prior Publication Data
US 2017/0349092 A1    Dec. 7, 2017

(30) Foreign Application Priority Data
Dec. 29, 2014 (KR) .................. 10-2014-0192113

(51) Int. Cl.
*B60Q 1/44* (2006.01)
*F21S 43/00* (2018.01)
(Continued)

(52) U.S. Cl.
CPC .............. *B60Q 1/441* (2013.01); *B60Q 1/44* (2013.01); *B60Q 11/00* (2013.01); *B60Q 11/005* (2013.01); *F21S 43/00* (2018.01); *G01R 31/005* (2013.01)

(58) Field of Classification Search
CPC .... B60Q 1/441; B60Q 11/005; G01R 31/005; G01R 31/006
(Continued)

(56) References Cited

U.S. PATENT DOCUMENTS 3,428,943 A * 2/1969 Carp .................. B60Q 11/005
340/458
3,728,705 A * 4/1973 Atkins ................ B60Q 11/005
315/82

(Continued)

FOREIGN PATENT DOCUMENTS

| JP | H9-99778 A | 4/1997 |
| JP | H9-150669 A | 6/1997 |
| KR | 20-0123503 Y1 | 5/1998 |
| KR | 10-2001-0065220 A | 7/2001 |
| KR | 10-2012-0129063 A | 11/2012 |

OTHER PUBLICATIONS

KR Notification of Reason for Refusal dated Mar. 2, 2015 as received in Application No. 10-2014-0192113 (English Translation).

(Continued)

*Primary Examiner* — John A Tweel, Jr.
(74) *Attorney, Agent, or Firm* — Maschoff Brennan

(57) ABSTRACT

An apparatus controls the forced light up of brake lights. The apparatus checks whether a brake light system has problems to prevent vehicle rear-ending accidents. A driver is informed, according to a state of a vehicle, about each problem. When there is a breakdown of the brake light system, such as a brake lights fuse disconnection, a breakdown of a brake lights relay, a wiring disconnection or defective wiring contact or the like, the driver is informed of the breakdown. Then rear vehicle is informed of danger by flickering a turn signal light since the brake lights do not light when the brake light system and the brake lights have broken down. The driver is informed of the breakdown of the brake light system and the brake lights by operating an (Continued)

internal alarm means whenever the driver steps on and releases the brake, thereby enabling the driver to drive safely.

2 Claims, 10 Drawing Sheets

(51) Int. Cl.
*B60Q 11/00* (2006.01)
*G01R 31/00* (2006.01)

(58) Field of Classification Search
USPC .......................................................... 340/479
See application file for complete search history.

(56) References Cited

U.S. PATENT DOCUMENTS

| | | | | |
|---|---|---|---|---|
| 4,320,383 | A * | 3/1982 | Lumbroso | B60Q 11/005 340/458 |
| 6,894,477 | B1 * | 5/2005 | Cuplin | G01R 19/0092 324/117 R |
| 8,982,578 | B2 * | 3/2015 | Bryan | B60Q 11/005 361/760 |

OTHER PUBLICATIONS

KR Grant of Patent dated Mar. 26, 2015 as received in Application No. 10-2014-0192113 (English Translation).

* cited by examiner

| Items | | Name Symbol | Operational Conditions | Logical Table |
|---|---|---|---|---|
| Input Unit (200) | Input | 230 | Brake switch input | - |
| | | 240 | Brake light relay input | - |
| | Output | 250 | - 12V Vehicle: 10V or more input<br>- 24V Vehicle: 20V or more input | FALSE |
| | | | - 12V Vehicle: 10V or less input<br>- 24V Vehicle: 20V or less input | TRUE |
| | | 260 | - Brake lights and the wiring to the brake lights are Normal | TRUE |
| | | | - Brake lights and the wiring to the brake lights are in Failure | FALSE |
| | | 270 | - 12V Vehicle: 10V or more input<br>- 24V Vehicle: 20V or more input | FALSE |
| | | | - 12V Vehicle: 10V or less input<br>- 24V Vehicle: 20V or less input | TRUE |
| | | 280 | - Brake switch ON | TRUE |
| | | | - Brake switch OFF | FALSE |

| Items | Name Symbol | Operational Condition | Logical Table |
|---|---|---|---|
| Input Unit Output (200) | 310 | DC 5 V power | 1 |
| | 312 | GROUND | 0 |
| Control Unit (300) | NOT1 | NOT 312 | TRUE |
| | AND1 | 310 AND NOT1 | TRUE |
| | OFF TIMER1 | AND1 (OFF in 0.5 second) | TRUE |
| Output Unit (400) | 350 | RELAY 1 operation (Brake light power output) | No operation |
| | 360 | RELAY 2 operation (Turn signal and buzzer ON/OFF output) | No operation |
| | 370 | Buzzer ON/OFF output (Output for 0.5 second) | Normal (Buzzer sound once) |

FIG. 12

| Items | Name Symbol | Operational Condition | Logical Table |
|---|---|---|---|
| | | Failure Type | Failure-A |
| Input Unit Output (200) | 250 | Relay check signal | 1 |
| | 270 | Brake light power signal | 1 |
| | 280 | Pedal input signal | 1 |
| Control Unit (300) | AND8 | 250 AND 280 | TRUE |
| | AND9 | OR4 AND 270 | TRUE |
| | OR4 | AND8 OR AND9 | TRUE |
| | OFF TIMER4 | AND9 (OFF in 1 second) | TRUE |
| Output Unit (400) | 350 | RELAY 1 operation (Brake light power output) | ON output |
| | 360 | RELAY 2 operation (Turn signal and buzzer ON/OFF output) | No operation |
| | 370 | Buzzer ON/OFF output (Output for 0.5-3 seconds) | Buzzer operation (Buzzer sound once) |

FIG. 13

| Items | | Name Symbol | Operational Conditions | | Logical Table |
|---|---|---|---|---|---|
| | | | Failure Type | | Failure-B |
| Input Unit Output (200) | | 260 | Brake light check signal | | 0 |
| | | 270 | Brake light power signal | | 0 |
| | | 280 | Pedal input signal | | 1 |
| Control Unit (300) | | NOT5 | NOT 260 | | TRUE |
| | | NOT6 | NOT 270 | | TRUE |
| | | NOT7 | NOT 280 | | FALSE |
| | | NOT8 | NOT AND6 | | TRUE |
| | | AND5 | NOT5 AND NOT6 | | TRUE |
| | | AND6 | OR3 OR NOT7 | | FALSE |
| | | AND7 | 280 * OFF TIMER3 (OFF in 1 second) | | TRUE |
| | | OR3 | AND5 OR AND6 | | TRUE |
| | | OFF TIMER3 | NOT8 (OFF in 1 second) | | TRUE |
| | | BLINKER2 | AND7 (Repetition of ON/OFF) | | TRUE |
| Output Unit (400) | | 350 | RELAY 1 operation (Brake light power output) | | No operation |
| | | 360 | RELAY 2 operation (Turn signal and buzzer ON / OFF output) | | ON / OFF output |
| | | 370 | Buzzer ON / OFF output (Output for 0.5-3 seconds) | | No Operation |

FIG. 14

| Items | Name Symbol | Operational Condition | Logical Table | | |
|---|---|---|---|---|---|
| | | Failure Type | Failure-C | Failure-D | Failure-E |
| Input Unit Output (200) | 250 | Relay check signal | 0 | - | - |
| | 260 | Brake light check signal | - | 0 | - |
| | 270 | Brake light power signal | - | - | 1 |
| | 280 | Pedal input signal | 0 | 0 | 0 |
| Control Unit (300) | NOT2 | NOT 250 | TRUE | - | - |
| | NOT3 | NOT 260 | - | TRUE | - |
| | NOT4 | NOT 280 | TRUE | TRUE | TRUE |
| | AND2 | NOT2 AND NOT4 | TRUE | - | - |
| | AND3 | NOT3 AND NOT4 | - | TRUE | - |
| | AND4 | 270 AND NOT4 | - | - | TRUE |
| | OR1 | AND2 AND AND3 | TRUE | TRUE | TRUE |
| | OR2 | OR1 AND AND4 | TRUE | TRUE | TRUE |
| | OFF TIMER2 | OR2 (OFF in 3 seconds) | TRUE | TRUE | TRUE |
| | BLINKER1 | OFF TIMER2 (Repetition of ON/OFF) | TRUE | TRUE | TRUE |
| Output Unit (400) | 350 | RELAY 1 operation (Brake light power output) | No operation | No operation | No operation |
| | 360 | RELAY 2 operation (Turn signal and buzzer ON/OFF output) | No operation | No operation | No operation |
| | 370 | Buzzer ON/OFF output (Output for 0.5-3 seconds) | Buzzer operation (Buzzer sound three times) | Buzzer operation (Buzzer sound three times) | Buzzer operation (Buzzer sound three times) |

# APPARATUS FOR CONTROLLING FORCED LIGHT UP OF BRAKE LIGHTS

TECHNICAL FIELD

The present invention relates to an apparatus for controlling forced light up of brake lights, and more particularly, to an apparatus for controlling forced light up of brake lights which checks if there is a problem with the brake light system, informs only the driver of the problem depending on the state of the vehicle, that is, senses a failure of the brake light system such as a broken brake light power fuse, a failure of the brake light relay, disconnection or poor contact of the wiring and informs the driver of the failure while forcibly turning on the brake lights whenever the driver applies the brake, and blinks, if not only the brake light system but also the brake lights malfunction, which results in failure to forcibly turn on the brake lights, a turn signal to alert vehicles travelling from behind and to operate an internal alarm means to inform the driver of failure of the brake light system and the brake lights whenever the driver applies and releases the brake in order to enable the driver to perform safe driving, thereby preventing the failure of the brake lights in the automobile from causing vehicle collision.

BACKGROUND ART

Generally, the brake light circuit is configured to turn on/off the brake light switch and turn on/off the brake light connected thereto according to the degree of the driver stepping on or off the foot brake.

An emergency light circuit which is blinked by the operation of the emergency light switch is also configured separately.

The brake light circuit is provided with a fuse to cut off the circuit when an instantaneous overcurrent flows through the brake light circuit, or an abnormality occurs in the brake light circuit. Accordingly, the brake light fuse may be cut off depending on the driving condition of the vehicle.

In addition, filaments in the brake lights may be broken due to thermal contraction and expansion when used for a long time.

Accordingly, in such a case, the driver cannot know whether the brake lights on back of the vehicle have failed. Further, if the brake lights are not turned on when the vehicle is quickly stopped due to an urgent situation, it is very likely that the rear vehicle will be in danger of a great accident.

Conventional systems detect faults or breaks of brake lights and notify the failure of the brake light relay, cut-off the brake light fuse, particularly, they are configured to check only short circuit of the brake lights. However, the conventional systems do not have a device that turns on the brake lights normally when the driver depresses the brake.

Therefore, the present invention proposes a system that turns on the brake lights normally and informs the driver that the brake lights are normally turned on but the brake light system malfunctions when the driver operates the brake only if the brake light bulbs and the wiring connected to the brake lights are in a normal condition in the case where the brake relay and the related wiring are in a fault state.

DISCLOSURE

Technical Problem

Therefore, the present invention has been made in view of the above problems, and it is a first object of the present invention to provide an apparatus for operating an alarm means or blinking a turn signal according to diagnosis of a failure type of an automobile brake light system such that the brake light system can check for the failure and repaired and for normally turning on the brake lights when the bulbs of the brake lights are in the normal condition.

Technical Solution

To achieve the above object, the present invention provides a solution.

That is, provided herein is an apparatus for controlling forced light up of brake lights, including: a power unit (100) for receiving a constant power and changing a voltage of the power to supply power to an input unit, a control unit and an output unit at a DC voltage of 5 V;

an input unit (200) for receiving a brake switch signal and a brake light output signal and providing the control unit with at least one of state information on whether a brake light fuse is in a normal condition or cut off or a wiring is disconnected, state information on whether a brake switch is operated or released, state information on whether or not a brake light operation power is normally applied, and state information on whether or not the power is applied to an output wiring of the brake lights;

a control unit (300) for generating, based on the state information provided through the input unit: an output signal for forcibly turning on the brake lights when the brake switch is operated and it is determined that the power for turning on the brake lights is not applied due to disconnection of a brake light fuse, a brake light relay and the wiring; an output signal for operating a turn signal lamp and an alarm means to alert a driver and another driver travelling from behind when the brake switch is operated and it is determined a failure has occurred in the brake lights or the wiring of the brake lights; or a brake light turn-on signal, a turn signal blinking signal and an output signal for operating the alarm means when: the brake switch is not operated and it is determined that the brake lights are kept turned on due to application of the power to a brake light turn-on circuit; a brake light bulb is short-circuited or the wiring is disconnected; or it is determined that the brake light fuse is broken or the brake light relay malfunctions; and an output unit (400) for operating the alarm means while outputting a power for turning on the brake lights to a power wiring for turning on the brake lights or a power for turning on the turn signal according to the output signal provided from the control unit.

Advantageous Effects

The present invention has the following effects.

From the moment the driver operates the ignition key of the automobile to operate the vehicle, it is possible to know the abnormality of the components constituting the brake light system, and even if a failure occurs in the brake light system, the brake lights may be normally turned on when the driver operates the brake only if the bulbs of the brake lights and the wiring thereof are in the normal condition, such that the vehicle can move safely all the way to a place where the driver can have the vehicle repaired and that, when even the brakes lights are broken, the emergency light can be blinked to alert rear vehicles to ensure safe travel of the rear vehicles every time the brake is applied and released.

In addition, the apparatus can be easily installed in a new vehicle as well as an existing vehicle, thereby providing high compatibility.

DESCRIPTION OF DRAWINGS

FIG. 10 shows a logic table for explaining the input unit of FIG. 4, and

FIG. 11 is a logic table operated according to FIG. 5.

FIG. 12 shows a logic table according to FIG. 6,

FIG. 13 shows a logic table according to FIG. 7, and

FIG. 14 is a logic table for operation of the respective types of failures (Failure-C, Failure-D, Failure-E) according to FIG. 8.

BEST MODE

Figure 1:
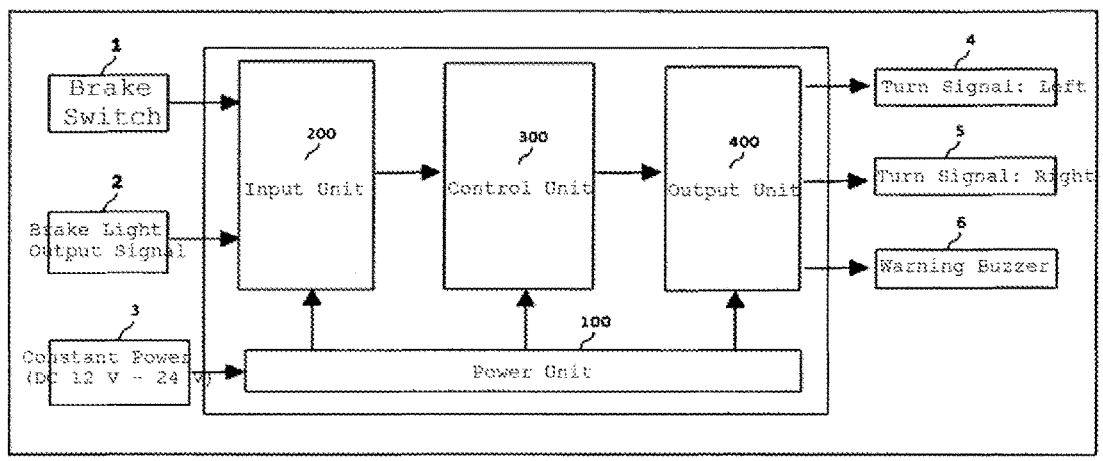
FIG. 1 is a block diagram of an apparatus for controlling forced light up of brake lights according to an embodiment of the present invention.

An apparatus for controlling forced light up of brake lights includes:

a power unit 100 for receiving a constant power and changing a voltage of the power to supply power to an input unit, a control unit and an output unit at a DC voltage of 5 V;

an input unit 200 for receiving a brake switch signal and a brake light output signal and providing the control unit with at least one of state information on whether a brake light fuse is in a normal condition or cut off or a wiring is broken, state information on whether a brake switch is operated or released, state information on whether or not a brake light operation power is normally applied, and state information on whether or not the power is applied to an output wiring of the brake lights;

a control unit 300 for generating, based on the state information provided through the input unit:

an output signal for forcibly turning on the brake lights when the brake switch is operated and it is determined that a fault has occurred and the power for turning on the brake lights is not applied due to disconnection of a brake light fuse, a brake light relay and wiring, an output signal for operating a turn signal lamp and an alarm means to alert a host driver and a driver travelling from behind when the brake switch is operated and it is determined a fault of malfunctioning of a brake light or wiring of the brake line has occurred, or a brake light turn-on signal, a turn signal blinking signal and an output signal for operating the alarm means when:

the brake switch is not operated and it is determined that the brake lights are kept turned on due to application of the power to a brake light turn-on circuit;

a brake light bulb is short-circuited or the wiring is disconnected; or it is determined that the brake light fuse is broken or the brake light relay malfunctions; and an output unit 400 for operating the alarm means while outputting a power for turning on the brake lights to a power wiring for turning on the brake lights or a power for turning on the turn signal according to the upper signal provided from the control unit.

MODE FOR INVENTION

Hereinafter, preferred embodiments of the present invention will be described in detail with reference to the drawings.

It is to be understood, however, that the scope of the present invention is not limited to these embodiments, and all such modifications as would be obvious to one skilled in the art are intended to be within the scope of the present invention.

In the present invention, the input unit 200 senses the state of each component of the brake light system using the resistance and the power polarity (+, −) of each component according to the operation situation of the brake light system, and transmits the result of sensing to the control unit 300. Then, the control unit 300 determines the failure according to the type of the failure based on the input state information on each component and transmits an output to the output unit 400 according to the failure type. Then, outputting a power for forcible turning on the brake lights, outputting a power for operating a turn signal, or driving an alarm buzzer or an LED lamp is performed according to three outputting methods according to the respective failures divided into five types in order to alert the driver and another driver of a vehicle traveling from behind to prevent failing to turn on the brake lights from causing an accident and to allow the driver to recognize any failure in the brake lights and the brake light systems at any time.

FIG. 1 is a block diagram of an apparatus for controlling forced light up of brake lights according to an embodiment of the present invention.

As shown in FIG. 1, the apparatus for controlling forced light up of brake lights includes a power unit 100, an input unit 200, a control unit 300, and an output unit 400.

The power unit 100 serves to receive a constant power and to change the voltage of the power to supply power to the input unit, the control unit and the output unit at a DC voltage of 5 V.

Specifically, the power unit 100 receives a constant power 3 of DC 12V to 24V according to the vehicle voltage, changes the voltage of power to drive electronic devices, and supplies DC 5V to the input unit 200, the control unit 300, and the output unit 400.

The input unit 200 receives a brake switch signal and a brake light output signal, and provides the control unit with at least one of first state information on whether a brake light fuse is in a normal condition or cut off or a wiring is disconnected, second state information on whether the brake switch is operated or released, third state information on whether or not a brake light operation power is normally applied, and fourth state information on whether or not the power is applied to an output wiring of the brake lights.

Specifically, a signal of a brake switch 1 and a brake light output signal 2 are received and the state of the brake light system is sensed. Then, the first to fourth state information are transmitted to the control unit 300 as a result of sensing. Then, the control unit 300 configured by logic gates determines a failure state of the vehicle based on the first to fourth status information and generates an output signal corresponding to the failure type, and the output unit 400, which is connected to the control unit 300, performs an output operation corresponding to the output signal input from the control unit 300.

The control unit 300 generates, based on the state information provided through the input unit: an output signal for forcibly turning on the brake lights when the brake switch is operated and it is determined that the power for turning on the brake lights is not applied due to disconnection of a brake light fuse, a brake light relay and the wiring; an output signal for operating a turn signal lamp and an alarm means to alert a driver and another driver travelling from behind when the brake switch is operated and it is determined a failure has occurred in the brake lights or the wiring of the brake lights; or a signal for operating the brake lights or an output signal for operating the turn signal and an alarm means when: the brake switch is not operated and it is determined that the brake lights are kept turned on due to application of the power to a brake light turn-on circuit; a brake light bulb is short-circuited or the wiring is disconnected; or it is determined that the brake light fuse is broken or the brake light relay malfunctions; and The output unit 400 outputs operating the alarm means while a power for turning on the brake lights to a power wiring for turning on the brake lights or a power for turning on the turn signal according to the output signal provided from the control unit.

Although the buzzer is used as the alarm means in the embodiment of the present invention, the alarm means may be implemented by a lamp if necessary. In this case, a separate lamp may be installed in the vehicle.

Figure 2:
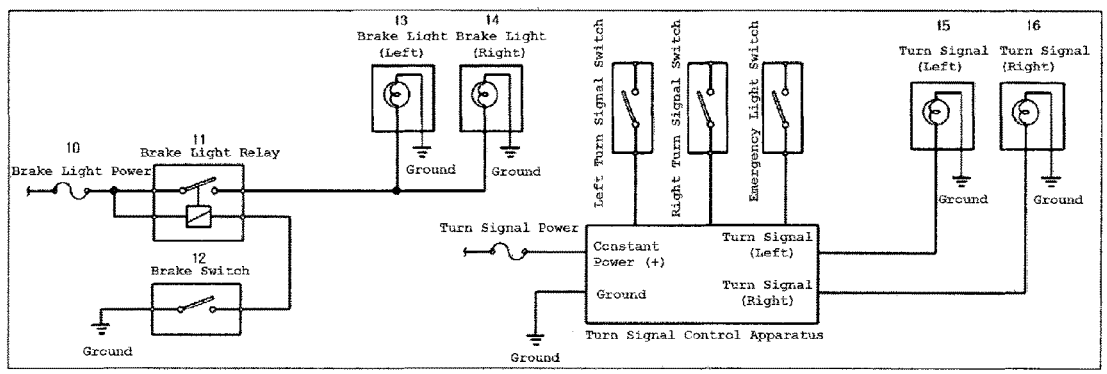
FIG. 2 is a configuration diagram of a brake light system of a typical vehicle.
Figure 3:
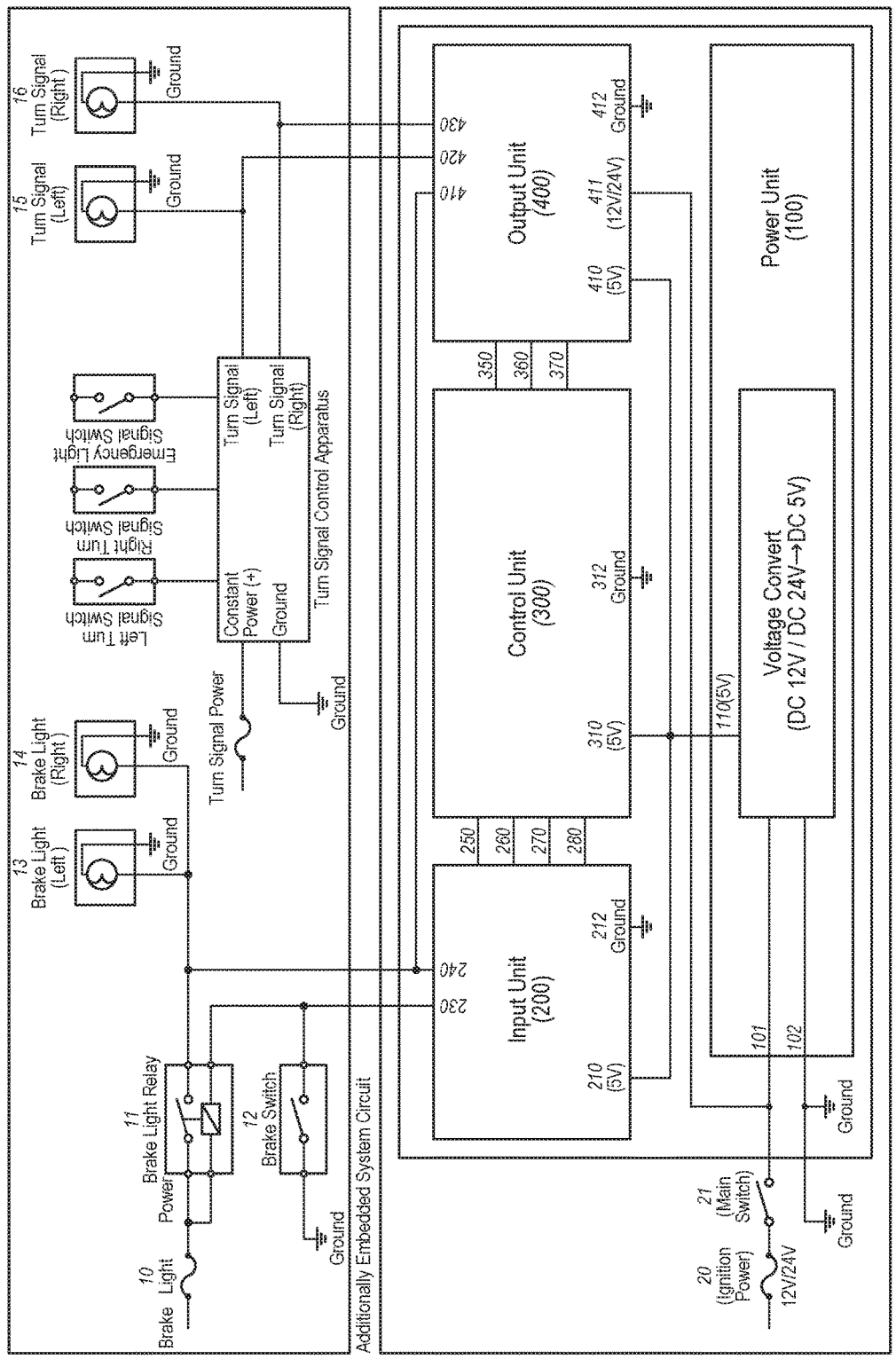
FIG. 3 is a circuit diagram illustrating configuring the apparatus of the present invention in the brake light system of the typical vehicle.

FIG. 2 is a configuration diagram of a brake light system of a typical vehicle, and FIG. 3 is a circuit diagram illustrating configuring the apparatus of the present invention in the brake light system of the typical vehicle.

As shown in FIG. 3, the apparatus of the present invention is connected to the circuit configuration of a conventional vehicle using only four circuits of the circuit configuration.

Figure 4:
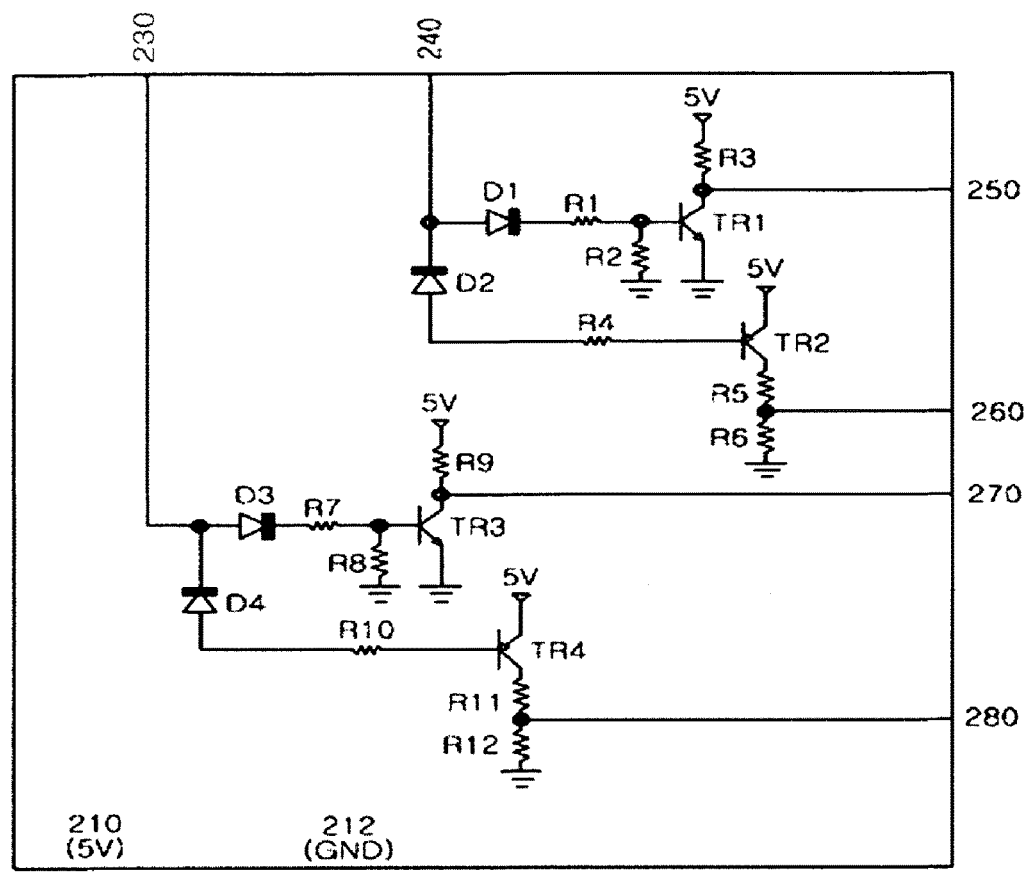
FIG. 4 is a detailed circuit diagram of an input unit of the apparatus for controlling forced light up of brake lights of the present invention.

FIG. 4 is a detailed circuit diagram of an input unit of the apparatus for controlling forced light up of brake lights of the present invention.

FIG. 10 shows a logic table for explaining the input unit of FIG. 4 the logic table of the control unit.

As shown in FIG. 4, the input unit 200 includes two circuits 230 and 240 connected to the circuit of conventional vehicle to receive a state signal, and four output signals 250, 260, 270, and 280 for sensing the state of the brake light system and transmitting the result of the sensing to the control unit 300.

More specifically, when the brake switch signal 230 is input, one of the two sensing circuits, which are connected inside the input unit 200, adjusts and set a resistance ratio such that the voltage input by a voltage decomposition circuit having R7 and R8 becomes the minimum voltage for operating the transistor TR3 when there is no abnormality in the brake light fuse 10. Here, the input voltage reference of the fuse is set to be greater than or equal to 20 V for a vehicle using 24 V and to be greater than or equal to 10 V for a vehicle using 12 V.

The reference voltage is a minimum voltage at which the coil of the brake light relay coil normally operates and the brake lights are turned on at normal brightness.

According to the operation of the transistor TR3 and the configuration of the peripheral circuit, the output circuit 270 outputs 'FALSE' if the brake light fuse 10 is normal, and 'TRUE' if the fuse 10 is cut off or the related wiring is disconnected.

In the other one of the two sensing circuits, the transistor TR4 is operated through R10 and D4 when the brake switch 12 is operated and grounded. According to the operation of the transistor TR4 and the configuration of the peripheral circuit, the output circuit 280 outputs 'TRUE' if the switch 12 is operated, and 'FALSE' if the brake switch 12 is released.

When the brake light output signal 240 is input, one of the two sensing circuits, which are connected inside the input unit 200, adjusts and set a resistance ratio such that the voltage input by a voltage decomposition circuit having R1 and R2 becomes the minimum voltage for operating the transistor TR1. The input voltage reference of the brake light operation power is set to be greater than or equal to 20 V for a vehicle using 24 V and to be greater than or equal to 10 V for a vehicle using 12 V.

The reference voltage is a minimum voltage for lighting the brake lights at normal brightness.

According to the operation of the transistor TR1 and the configuration of the peripheral circuit, the output circuit 250 outputs 'FALSE' if the brake light operation power is normally applied, and 'TRUE' if the power is not applied.

The other one of the two sensing circuits is a sensing circuit for sensing the failure in the brake lights and the wiring connected to the brake lights when the brake light operation power is not applied. The circuit is grounded through the wiring connected to the brake lights and the bulbs of the brake lights, the transistor TR2 is operated through D2 and R4. According to the operation of the transistor TR2 and the configuration of the peripheral circuit, the output circuit 260 outputs 'TRUE' if the bulbs of the brake lights and the wiring connected to the brake lights are normal, and 'FALSE' if a failure occurs in any of the bulbs of the brake lights and the wiring.

Figure 5:
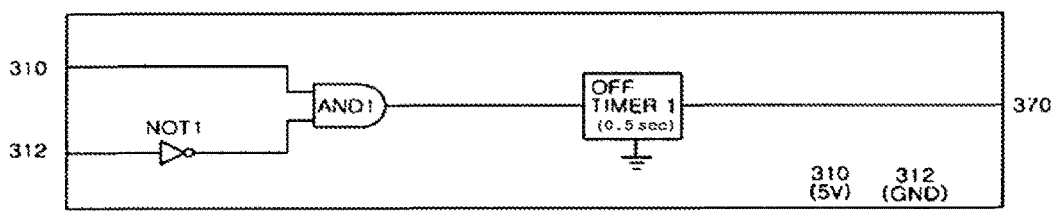
FIG. 5 is a logic diagram for checking the power input state of the apparatus for controlling forced light up of brake lights of the present invention.

FIG. 5 is a logic configuration diagram for checking the power input state of the control unit 300, and FIG. 11 is a logic table operated by FIG. 5.

When the key is turned to On, the ignition power 20 is applied to the vehicle, a positive voltage is applied to 310. If 312 is grounded, the output of AND1 is turned on by the logical product of NOT1 and 310, and the output of OFF TIMER1 is turned off in 0.5 seconds. At this time, the ON output is generated on 370 for 0.5 second and the buzzer sounds once to inform the driver that the brake light control apparatus is normally driven.

Depending on setting of the timer time, the buzzer may sound more than once for more than 0.5 seconds.

Figure 6:
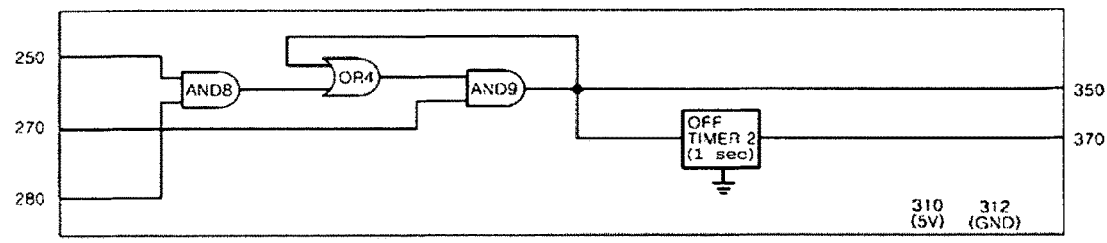
FIG. 6 is a circuit diagram illustrating generating an output signal in a control unit to forcibly turn on the brake lights when it is determined that a failure (Failure-A) to apply a power for turning on the brake lights has occurred due to disconnection of a brake light fuse, a brake light relay and a related wiring when the brake switch is operated in the case where it is sensed, based on a component state sensing signal input through the input unit of the apparatus for controlling forced light up of the brake lights of the present invention, that the brake lights and the wiring connected thereto are in the normal condition.

FIG. 6 is a circuit diagram illustrating generating an output signal in the control unit 300 to forcibly turn on the brake lights 13 and 14 when it is determined that a failure (Failure-A) to apply a power for turning on the brake lights 13 and 14 has occurred due to disconnection of the brake light fuse 10, the brake light relay 11 and the related wiring when the brake switch 12 is operated in the case where it is sensed, based on a component state sensing signal input through the input unit 200, that the brake lights and the wiring connected thereto are in the normal condition. FIG. 12 shows a logic table according to FIG. 6.

To forcibly turn on the brake lights, the control unit 300 includes:

a first logic gate AND8 for determining a failure state by a logical product of a brake relay output signal 250 and a brake operation signal 280 when the brake relay output signal is not sensed during operation of the brake switch;

a second logic gate OR4 configured to maintain the failure state until the brake operation is released;

a third logic gate AND9 for maintaining the failure state to be output until a brake operation release signal is acquired and for turning off the output signal when the brake is released; and an alarm means (OFF TIMER 2) operative to notify a state of forced lighting of the brake lights.

More specifically, if the power for turning on the brake lights is not applied while the brake switch 12 is operated, the signal 250 indicates 'TRUE'. In this case, the input signal 270 also indicates 'TRUE' because the brake switch 12 is operated. Thereby, the logical product AND8 of the signal input 250 and the signal input 280 is output as 'TRUE', which is provided over the output signal 350 until the brake is released by the logical product AND9 of OR4 and 270. At the same time, the output of the AND9 is applied to the OFF TIMER2. The OFF TIMER2 maintains the output 370 in the ON state for 1 second to operate the buzzer operates once to inform the driver that the brake lights 13 and 14) have been normally turned on by forced driving, but there is a failure in the system.

Figure 7:
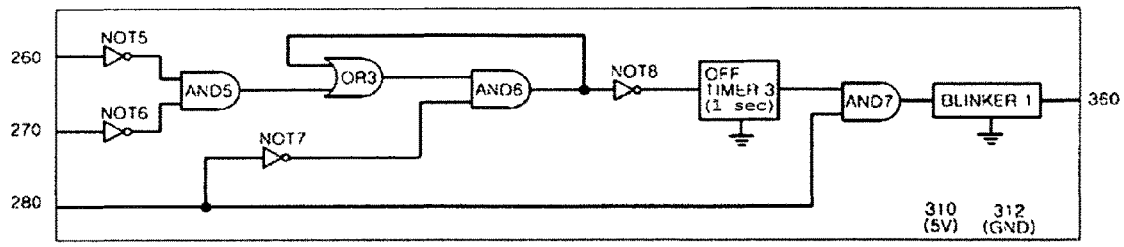
FIG. 7 is a logic diagram for operating a turn signal and a buzzer for 3 seconds for the control unit to alert both the driver of a vehicle and the driver of another vehicle traveling from behind regardless of the failure such as disconnection of the brake light fuse, the brake light relay and the related wiring when the brake switch 12 is operated while a failure (Failure-B) indicating a fault state of the brake lights and the wiring connected to the brake lights is sensed based on a component state signal input through the input unit of the apparatus for controlling forced light up of the brake lights of the present invention because the brake lights cannot be forcibly driven.

FIG. 7 is a logic diagram for operating a turn signal and a buzzer for 3 seconds for the control unit 300 to alert both the driver of a vehicle and the driver of another vehicle traveling from behind regardless of the failure such as disconnection of the brake light fuse 10, the brake light relay 11 and the related wiring when the brake switch 12 is operated while a failure (Failure-B) indicating a fault state of the brake lights 13 and 14 and the wiring connected to the brake lights is sensed based on a component state signal input through the input unit 200 because the brake lights cannot be forcibly driven. FIG. 13 shows a logic table according to FIG. 7.

More specifically, if all the brake lights 13 and 14 fail while the brake switch 12 is not operated, the signal input 260 becomes 'FALSE' by the circuit configuration of the input unit 200, and 'TRUE' by NOT5. At the same time, since the brake switch is not operated, the signal input 270 is 'FALSE' and becomes 'TRUE' by NOT6. Therefore, the logical product of NOT5 and NOT6 is set to 'TRUE' and input to OR3. Since the signal input 280 is 'FALSE' when the brake switch 12 is not operated, the signal is set to 'TRUE' by NOT7, and a self-holding circuit is formed by OR3. Therefore, once AND6 becomes 'TRUE', 'TRUE' is held until the brake switch 12 is operated, and OFF TIMER3 does not operate because AND6 is set to 'FALSE' by NOT8.

At this time, if the brake switch 12 is operated, the logical product AND7 of the OFF TIMER 3 and the input signal 280 becomes 'TRUE'. Thus, 'TRUE' is applied to the BLINKER for 3 seconds, and a blinking operation is generated in the output 360 for 3 seconds.

Figure 8:
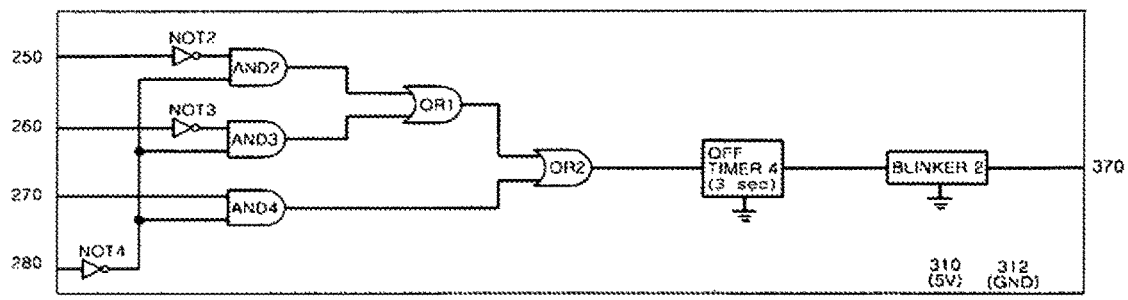
FIG. 8 is a logic diagram for determining the type of a failure that occurs when the driver does not step on the brake and generating an output according to the type, in the failure diagnosis for each type of failure in the apparatus for controlling forced light up of the brake lights of the present invention.

FIG. 8 is a logic diagram for determining the type of a failure that occurs when the driver does not step on the brake and generating an output according to the type in the failure diagnosis for each type of failure. FIG. 14 is a logic table for operation of the respective types of failures (Failure-C, Failure-D, Failure-E) according to FIG. 8.

Failure, which can be determined when the driver does not step on the brake, may be divided into three types: Failure-C, Failure-D and Failure-E. Since the brake is not applied, the buzzer for informing only the driver of the failure will operate for 3 seconds.

Failure-C indicates that power is applied to the turn-on circuit of the brake lights 13 and 14 without the brake switch 12 being operated and thus the brake lights 13 and 14 are kept on regardless of operation of the brake switch. Since the switch 12 is not operated, the signal input 280 is 'FALSE' and 'TRUE' is applied to AND2 by NOT4. At this time, if power is applied to the brake lights 13 and 14, the input signal 250 becomes 'FALSE', 'TRUE' is applied by NOT2, 'TRUE' is set by the logical product AND2 of NOT4 and NOT2, and 'TRUE' is applied by OR1.

Failure-D indicates that the bulbs of the brake lights are broken or the wiring connected to the brake lights is disconnected while the brake switch 12 is not operated. Since the brake switch 12 is not operated, the signal input 280 is 'FALSE' and 'TRUE' is applied to AND3 by NOT4. At this time, if the light bulbs of the brake lights 13 and 14 are broken or the wiring leading to the brake lights 13 and 14 is disconnected, the signal input 260 is set to 'FALSE' by the input unit 200 and set to 'TRUE' by NOT3, and 'TRUE' is produced by the logical product AND3 of NOT3 and NOT4 and applied to OR1.

Failure-E indicates that the brake light fuse 10 is cut off or the brake light relay 11 malfunctions while the brake switch 12 is not operated. Since the brake switch 12 is not operated, the signal input 280 is 'FALSE' and, and 'TRUE' is applied to AND4 by NOT4. At this time, if power is not applied to the input 230 of the input unit 200 due to cut-off of the brake light fuse 10 or a fault of the brake light relay 11, the signal input 270 of the control unit 300 becomes 'TRUE', and 'TRUE' is produced by the logical product AND4 of NOT4 and the signal input 270 and applied to OR2.

If any of the three types of failure is input to OR1 and OR2, 'TRUE' is applied to OFF TIMER 4. Then, OFF TIMER applies 'TRUE' to BLINKER2 for 3 seconds, and BLINKER2 generates a blinking signal for 3 seconds and applies the same to the output 371 to drive the turn signals 15 and 16 and a buzzer.

Figure 9:
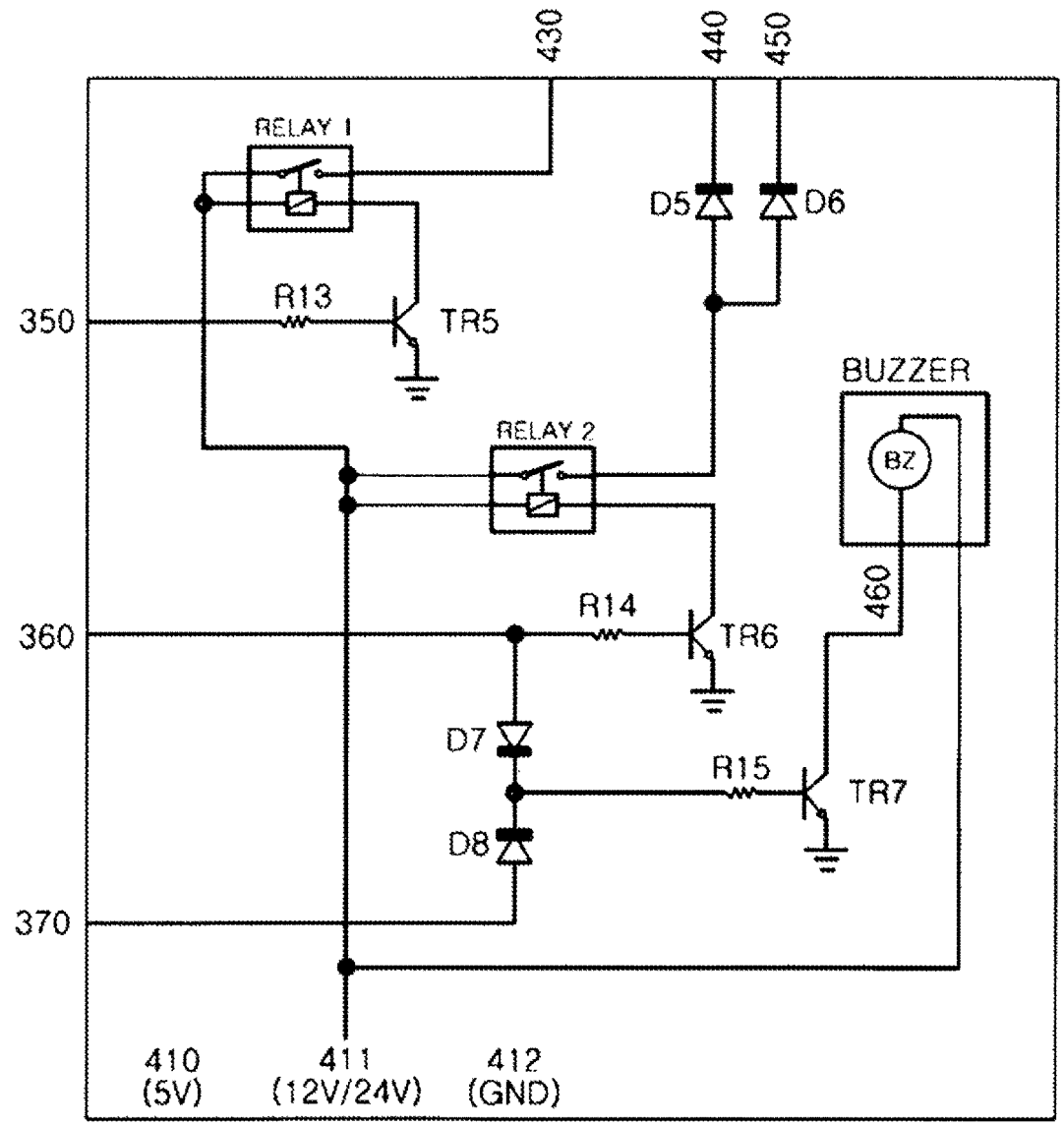
FIG. 9 is a circuit diagram of an output unit for driving an appropriate load according to an output signal generated by the control unit of the apparatus for controlling forced light up of the brake lights of the present invention.

FIG. 9 is a circuit diagram of an output unit for driving an appropriate load according to an output signal 350,360,370 generated by the control unit 300.

Specifically, when 'TRUE' is input to the signal input 350, RELAY1 is driven to output power for lighting the brake lights 13 and 14 to a wiring for lighting the brake lights 13 and 14, which is connected to the output terminal 430.

When 'TRUE' is input to the signal input 360, RELAY2 is driven to output power for turning on the turn signals 15 and 16 connected to 440 and 450. At this time, when the transistor (TR7) is driven by a signal applied through D7 and R15, the BUZZER is operated.

The reference numerals in the drawings are as follows.

Reference numeral '101' denotes a power source (DC 12V, DC 24V) input, '102' denotes a ground input, '110' denotes a DC 5V output, '210,' '310' and '410' denote DC 5V inputs, '212,' '312' and '412' denote ground, '230' denote a brake switch input, '240' denotes a brake light output signal, '250' denotes a brake light power output detection signal, '260' denotes a brake light disconnection detection signal, and '270' denotes a brake release state detection signal, '280' denotes a brake operation state detection signal, '350' denotes a brake light forced turn-on signal, and '360' denotes a turn signal (left/right) blinking signal output, '370' denotes a buzzer ON/OFF signal output, '411' denotes an input of DC 12 V or DC 24 V, '430' denotes a brake light forced turn-on output, '440' denotes a turn-on power output of a turn signal (left), '450' denotes a turn-on power output of a turn signal (right), '460' denotes a buzzer operation power output, 'R1' to 'R15' denote resistors, 'D1' to 'D8' denote diodes, 'TR1' to 'TR7' denote transistors, 'RELAY 1' and 'RELAY 2' denote relays driven DC 12 V or DC 24 V, 'BUZZER' denotes a buzzer with a built-in circuit, 'AND1' to 'AND9' denote AND logic gate devices, 'OR1' to 'OR4' denote OR logic gate devices, 'NOT1' to 'NOT8' denote NOT logic gate devices, 'OFF TIMER 1' (0.5 sec) denotes a device or circuit element whose output is turned ON when power is applied and then turned OFF in 0.5 second, 'OFF TIMER 3' and 'OFF TIMER 4 (1 sec)' denote devices or circuit elements whose output is turned ON when power is applied and then turned OFF in 1 second, and 'OFF TIMER 2 (3 sec)' denotes a device or circuit element whose output is turned ON when power is applied and then turned OFF in 3 seconds, and 'BLINKER 1' and 'BLINKER 2' denote devices or circuit elements which repeatedly output ON and OFF when power is applied.

According to the present invention, From the moment the driver operates the ignition key of the automobile to operate the vehicle, it is possible to know the abnormality of the components constituting the brake light system, and even if a failure occurs in the brake light system, the brake lights may be normally turned on when the driver operates the brake only if the bulbs of the brake lights and the wiring thereof are in the normal condition, such that the vehicle can move safely all the way to a place where the driver can have the vehicle repaired and that, when even the brakes lights are broken, the emergency light can be turned on to alert rear vehicles to ensure safe travel of the rear vehicles every time the brake is applied and released.

Although an embodiment of an apparatus for controlling forced light up of brake lights to which the technical idea of the present invention is applied has been described, there may be various modified inventions having the same technical idea. It is obvious that those modifications are also within the scope of the present invention.

INDUSTRIAL APPLICABILITY

The present invention is used as an apparatus for controlling forced light up of brake lights, and is applicable to other vehicle and robot industries.

The invention claimed is:

1. An apparatus for controlling forced light up of brake lights, comprising:
a power unit for receiving a constant power and changing a voltage of the power to supply power to an input unit, a control unit and an output unit at a DC voltage of 5 V;
an input unit for receiving a brake switch signal and a brake light output signal and providing the control unit with at least one of state information on whether a brake light fuse is in a normal condition or cut off or a wiring is disconnected, state information on whether a brake switch is operated or released, state information on whether or not a brake light operation power is normally applied, and state information on whether or not the power is applied to an output wiring of the brake lights;
a control unit for generating, based on the state information provided through the input unit: an output signal for forcibly turning on the brake lights when the brake switch is operated and it is determined that the power for turning on the brake lights is not applied due to disconnection of a brake light fuse, a brake light relay and the wiring;
an output signal for operating a turn signal lamp and an alarm means to alert a driver and another driver travelling from behind when the brake switch is operated and it is determined a failure has occurred in the brake lights or the wiring of the brake lights; or
a brake light turn-on signal, a turn signal blinking signal and an output signal for operating the alarm means when:
the brake switch is not operated and it is determined that the brake lights are kept turned on due to application of the power to a brake light turn-on circuit;
a brake light bulb is short-circuited or the wiring is disconnected; or
it is determined that the brake light fuse is broken or the brake light relay malfunctions; and
an output unit for operating the alarm means while outputting a power for turning on the brake lights to a power wiring for turning on the brake lights or a power for turning on the turn signal according to the output signal provided from the control unit, wherein the control unit forcibly turns on the brake lights, and comprises:
a first logic gate for determining a failure state by a logical product of a brake relay output signal and a brake operation signal when the brake relay output signal is not sensed during operation of the brake switch;
a second logic gate configured to maintain the failure state until the brake operation is released;
a third logic gate for maintaining the failure state to be output until a brake operation release signal is acquired and for turning off the output signal when the brake is released; and
an alarm means operative to notify a state of forced lighting of the brake lights.

2. An apparatus for controlling forced light up of brake lights, comprising:
an input unit for sensing a state of a brake light system component such that the brake lights can be forcibly turned on when a driver operates a brake switch even if disconnection of a brake light relay and a wiring except for a short circuit of bulbs of the brake lights occurs;

a control unit for determining, with reference to a state value of the component delivered from the input unit, whether a failure type is a brake light power, the brake light relay, or disconnection of the wiring, generating a control output signal corresponding to the failure type, and providing the control output signal to the output unit; and an output unit for outputting a power for turning on the brake lights to the power wiring for turning on the brake lights or a power for blinking a turn signal and operating an alarm means according to the output signal provided from the control unit, wherein the control unit forcibly turns on the brake lights, and comprises:

a first logic gate for determining a failure state by a logical product of a brake relay output signal and a brake operation signal when the brake relay output signal is not sensed during operation of the brake switch;

a second logic gate configured to maintain the failure state until the brake operation is released;

a third logic gate for maintaining the failure state to be output until a brake operation release signal is acquired and for turning off the output signal when the brake is released; and an alarm means operative to notify a state of forced lighting of the brake lights.

* * * * *